(12) United States Patent
Chen et al.

(10) Patent No.: US 9,899,427 B2
(45) Date of Patent: Feb. 20, 2018

(54) SELF-EMISSION TYPE DISPLAY

(71) Applicant: AU OPTRONICS CORPORATION, Hsin-chu (TW)

(72) Inventors: Chen-Chang Chen, Hsin-chu (TW); Tsung-Tien Wu, Hsin-chu (TW); Wen-Wei Yang, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 15/267,304

(22) Filed: Sep. 16, 2016

(65) Prior Publication Data
US 2017/0229482 A1 Aug. 10, 2017

(30) Foreign Application Priority Data

Feb. 5, 2016 (TW) .............................. 105103971 A

(51) Int. Cl.
H01L 33/62 (2010.01)
H01L 33/18 (2010.01)
(Continued)

(52) U.S. Cl.
CPC .......... *H01L 27/124* (2013.01); *H01L 25/167* (2013.01); *H01L 33/38* (2013.01); *H01L 33/62* (2013.01)

(58) Field of Classification Search
CPC . H01L 25/0753; H01L 25/167; H01L 27/124; H01L 33/18; H01L 33/30; H01L 33/34; H01L 33/62
See application file for complete search history.

(56) References Cited

U.S. PATENT DOCUMENTS 6,246,107 B1 * 6/2001 Silvestre ................. H01L 23/50
257/666
2006/0231852 A1 * 10/2006 Kususe .................... H01L 24/06
257/99
(Continued)

FOREIGN PATENT DOCUMENTS

TW 201228039 A 7/2012
TW 201347140 A 11/2013

OTHER PUBLICATIONS

Office Action issued by (TIPO) Intellectual Property Office, Ministry of Economic Affairs, R. O. C. dated Jan. 5, 2017 for Application No. 105103971, Taiwan.

*Primary Examiner* — Fazli Erdem
(74) *Attorney, Agent, or Firm* — Tim Tingkang Xia, Esq.; Locke Lord LLP

(57) ABSTRACT

A self-emission type display including a carrier substrate, a light-emitting element, a first electrode, and a second electrode is provided. The light-emitting element is disposed on the carrier substrate and has a first pad and a second pad. The first electrode has a plurality of first stripe portions electrically connected to a first electric potential. The first pad of the light-emitting element is electrically connected to the carrier substrate through at least one first strip portion. The second electrode has a plurality of second stripe portions electrically connected to a second electric potential. The first electrode and the second electrode are separated from each other. The second pad of the light-emitting element is electrically connected to the carrier substrate through at least one second strip portion. The first electric potential is different from the second electric potential.

16 Claims, 6 Drawing Sheets

(51) Int. Cl.
  *H01L 27/12*      (2006.01)
  *H01L 25/16*      (2006.01)
  *H01L 33/38*      (2010.01)

(56) References Cited

U.S. PATENT DOCUMENTS

| | | | |
|---|---|---|---|
| 2006/0255342 A1* | 11/2006 | Kim | H01L 33/32 |
| | | | 257/79 |
| 2009/0085885 A1 | 4/2009 | Wu et al. | |
| 2010/0059765 A1* | 3/2010 | Lester | H01L 33/38 |
| | | | 257/79 |
| 2010/0187563 A1* | 7/2010 | Kuramoto | H01L 24/27 |
| | | | 257/99 |
| 2010/0190298 A1* | 7/2010 | Kuramoto | H01L 21/187 |
| | | | 438/121 |
| 2012/0168794 A1* | 7/2012 | Yu | H01L 33/44 |
| | | | 257/98 |
| 2013/0270418 A1* | 10/2013 | Cho | G02F 1/015 |
| | | | 250/206.1 |
| 2013/0292813 A1 | 11/2013 | Yang | |
| 2014/0231859 A1* | 8/2014 | Kim | H01L 33/38 |
| | | | 257/99 |

* cited by examiner

SELF-EMISSION TYPE DISPLAY

CROSS-REFERENCE TO RELATED APPLICATION

This non-provisional application claims priority to and benefit of, under 35 U.S.C. § 119(a), Patent Application No. 105103971 filed in Taiwan R.O.C. on Feb. 5, 2016, the entire content of which is hereby incorporated by reference.

TECHNICAL FIELD

The present invention relates to a self-emission type display, and more specifically to a self-emission type display having stripe electrodes.

BACKGROUND ART

With the advances in semiconductor technology, current light-emitting diodes have been provided with high brightness output. Because light-emitting diodes have the advantages such as power conservation, small volume, low-voltage driving, and being free of Hg, they have been widely used in the fields of displays and illumination to form self-emission type displays.

Generally, a light-emitting diode (LED) in a self-emission type display is mounted on a substrate via a mechanical device or a PDMS transfer process. However, the problems of alignment and precision may occur in the transfer process; as a result, in other processes, a large area of interconnection is required to make up for inadequate alignment in order to avoid the problem of disconnection. The large area of interconnection region, however, results in a decrease in light output efficiency of a self-emission type display.

SUMMARY

The present invention provides a self-emission type display, making it possible to effectively improve light output efficiency.

The present invention provides a self-emission type display, comprising a carrier substrate, a light-emitting element, a first electrode, and a second electrode. The light-emitting element is disposed on the carrier substrate and has a first pad and a second pad. The first electrode has a plurality of first stripe portions connected to a first electric potential. The first pad of the light-emitting element is electrically connected to the carrier substrate through at least one of the first strip portions. The second electrode has a plurality of second stripe portions connected to a second electric potential. The first electrode and the second electrode are separated from each other. The second pad of the light-emitting element is electrically connected to the carrier substrate through at least one of the second strip portions. The first electric potential is different from the second electric potential.

In sum, since the self-emission type display of the present invention has the electrodes extending to a large extent, it can be ensured that even when a mounting alignment error occurs, the LED can still be connected to the electrodes successfully, avoiding the problem of disconnection. Meanwhile, the electrodes of the present invention are stripe electrodes, such that light emitted by the LED is transmitted through spaces between the stripe electrodes, thereby effectively improving its light output efficiency.

To make the above characteristics and advantages of the present disclosure clearer and easier to understand, the following embodiments are described in detail in conjunction with accompanying figures.

BRIEF DESCRIPTIONS OF THE DRAWINGS

DETAILED DESCRIPTIONS

Figure 1A:
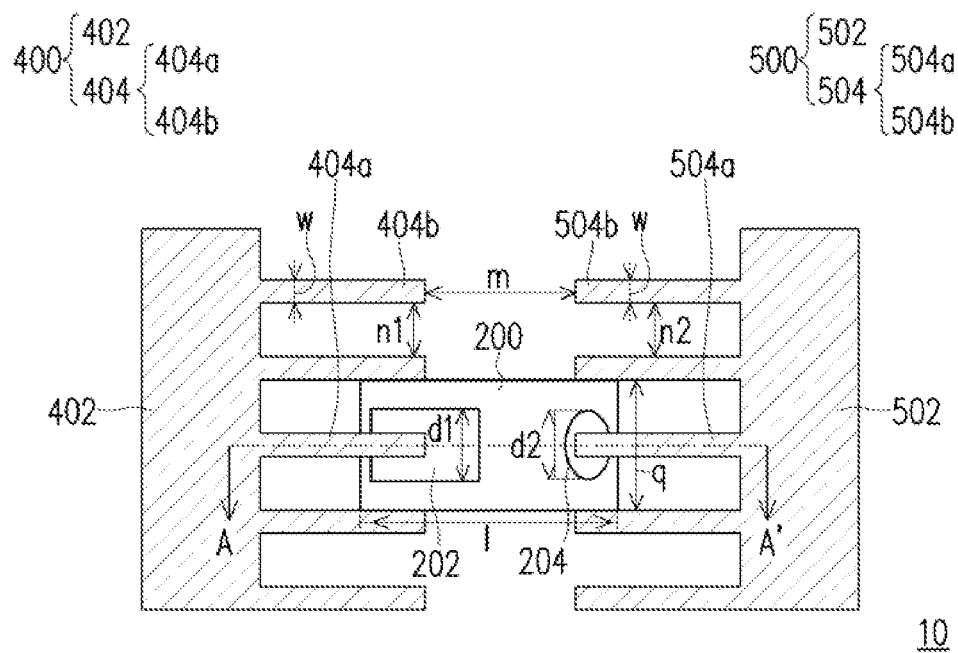
FIG. 1A is a schematic top-view drawing of a self-emission type display according to one embodiment of the present invention.
Figure 1B:
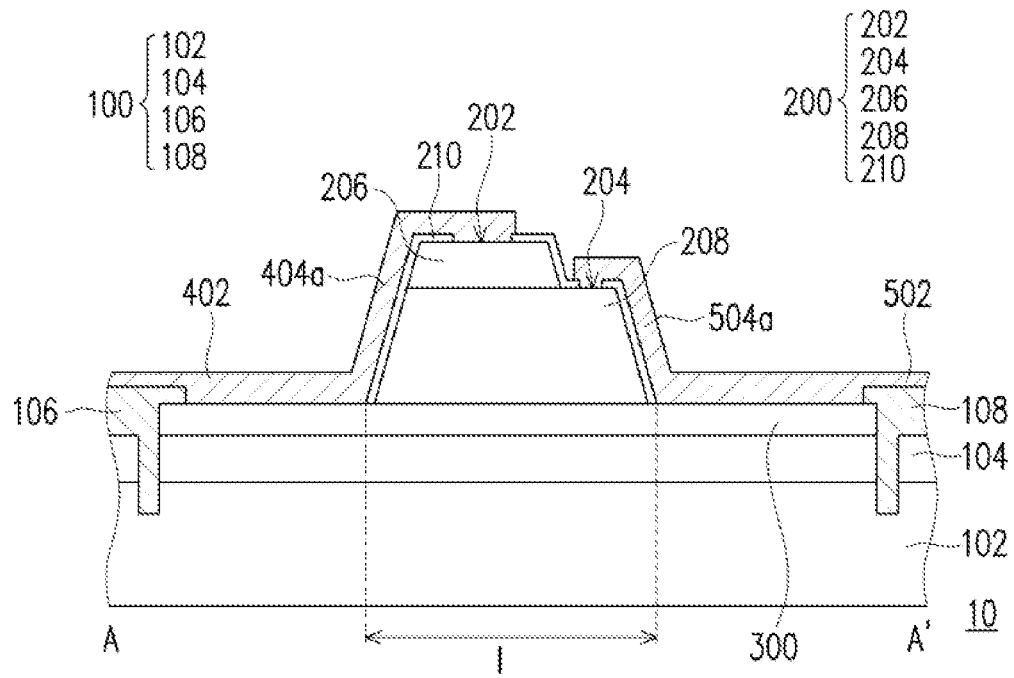
FIG. 1B is a cross-sectional schematic drawing taken along the line A-A' in the self-emission type display of FIG. 1A.

FIG. 1A is a schematic top-view drawing of a self-emission type display 10 according to one embodiment of the present invention. FIG. 1B is a cross-sectional schematic drawing taken along the line A-A' in the self-emission type display of FIG. 1A. Please refer to both FIG. 1A and FIG. 1B. The self-emission type display 10 comprises a carrier substrate 100, a light-emitting element 200, an adhesion layer 300, a first electrode 400, and a second electrode 500.

In the present embodiment, the carrier substrate 100 comprises an active element array substrate 102, a passivation layer 104, a first connection electrode 106, and a second connection electrode 108. The active element array substrate 102 may comprise a plurality of scanning lines, a plurality of data lines, and a plurality of active elements electronically connected to the scanning lines and the data lines (not shown). The active element may be a bottom gate TFT or a top gate TFT and comprises a gate, a channel, a source, and a drain. In the present embodiment, the active element array substrate 102 can provide a first electric potential V1 and a second electric potential V2 to other elements through the gate TFTs. However, the present invention is not limited thereto. In another embodiment, the active element array substrate 102 may comprise other similar active elements, as long as they can provide the first electric potential V1.

The passivation layer 104 is disposed on the active element array substrate 102, and a material of the passivation layer 104 may be an inorganic material (such as silicon oxide, silicon nitride, silicon oxynitride, or another suitable material, or a stacked layer of at least two of the above materials), an organic material, another suitable material, or a combination thereof. The first connection electrode 106 and the second connection electrode 108 are disposed on the passivation layer 104. The first connection electrode 106 and the second connection electrode 108 are made of electrically conducting materials. Specifically, the first connection electrode 106 and the second connection electrode 108 may be a single layer or a stacked structure of multiple layers of low-resistance electrically conducting materials, including Au, Cu, Ti, Al, Cr, Pt, another conductive material, or a combination thereof. However, the present invention is not limited thereto. In another embodiment, the first connection electrode 106 and the second connection electrode 108 may also comprise metal oxides, such as indium tin oxide, indium zinc oxide, aluminum tin oxide, aluminum zinc oxide, indium germanium zinc oxide, or other suitable metal oxides. The first connection electrode 106 passes through the passivation layer 104 to be electrically connected to the active element array substrate 102. Specifically, in the present embodiment, the first connection electrode 106 may be electrically connected to the drain of the active element to have the first electric potential V1. However, no specific limitation regarding the connecting method of the first connection electrode 106 to the active element array substrate 102 exists in the present invention; the only condition being that the first connection electrode 106 has the first electric potential V1 through the active element array substrate 102. Additionally, the second connection electrode 108 is also electrically connected to the active element array substrate 102 and is connected to the second electric potential V2, different from the first electric potential V1. Specifically, in the present embodiment, the second electric potential V2 is a common potential V1, and the first electric potential V1 is greater than the second electric potential V2.

The adhesion layer 300 is disposed between the light-emitting element 200 and the passivation layer 104, to fix the light-emitting element 200 on the carrier substrate 100. The adhesion layer 300 may be a transparent adhesion layer or an opaque adhesion layer. Specifically, the material of the adhesion layer 300 may be adjusted depending on the light emission direction of the light-emitting element 200. In the present embodiment, the light-emitting element 200 is, for example, a light-emitting diode (LED). The LED 200 has a first pad 202, a second pad 204, a first-type semiconductor layer 206, a second-type semiconductor layer 208, and an insulating layer 210, wherein the first pad 202 is electrically connected to the first-type semiconductor layer 206, and the second pad 204 is electrically connected to the second-type semiconductor layer 208. Specifically, in the present embodiment, the first-type semiconductor layer 206 is an example using a P-type semiconductor layer, and the second-type semiconductor layer 208 is an example using an N-type semiconductor layer. However, the present invention is not limited thereto. In another embodiment, the types of the semiconductor layers may also be interchanged, with one condition that the first-type semiconductor layer 206 and the second-type semiconductor layer 208 belong to different types of semiconductor layers. A material of the P-type semiconductor layer is, for example, amorphous silicon or microcrystalline silicon, and a material doped with it is, for example, selected from Group IIIA of the Periodic Table, such as B, Al, Ga, In, or Tl. On the other hand, a material of the N-type semiconductor layer is, for example, amorphous silicon or microcrystalline silicon, and a material doped with it is, for example, selected from Group VA of the Periodic Table, such as P, As, Sb, or Bi. In the present embodiment, the first pad 202 and the second pad 204 are formed by covering the first-type semiconductor layer 206 and the second-type semiconductor layer 208 with the insulating layer 210 and exposing a part of the first-type semiconductor layer 206 and a part of the second-type semiconductor layer 208. In other words, in the present embodiment, the first pad 202 and the second pad 204 are a part of the first-type semiconductor layer 206 and a part of the second-type semiconductor layer 208 respectively. However, the present invention is not limited thereto. In embodiments described later, the first pad 202 and the second pad 204 may also be other elements disposed on the first-type semiconductor layer 206 and the second-type semiconductor layer 208. Additionally, a material of the insulating layer 210 comprises an inorganic material (such as silicon oxide, silicon nitride, silicon oxynitride, another suitable material, or a stacked layer of at least two of the above materials), an organic material, or another suitable material, or a combination thereof.

In the present embodiment, the first electrode 400 and the second electrode 500 cover the light-emitting element 200. Materials of the first electrode 400 and the second electrode 500 may be the same as or different from the materials of the first connection electrode 106 and the second connection electrode 108. In other words, the first electrode 400 and the second electrode 500 may be a single layer or a stacked structure of multiple layers of low-resistance electrically conducting materials, including Au, Cu, Ti, Al, Cr, Pt, another conductive material, or a combination thereof. On the other hand, the materials of the first electrode 400 and the second electrode 500 may also comprise metal oxides, such as indium tin oxide, indium zinc oxide, aluminum tin oxide, aluminum zinc oxide, indium germanium zinc oxide, or other suitable metal oxides. The first electrode 400 has a first main body portion 402 and a plurality of first stripe portions 404, and the second electrode 500 has a second main body portion 502 and a plurality of second stripe portions 504. In the present embodiment, the first stripe portions 404 are connected to the first main body portion 402, and the second stripe portions 504 are connected to the second main body portion 502. In other words, the first stripe portions 404 are electrically connected to the first main body portion 402, and the second stripe portions 504 are electrically connected to the second main body portion 502. The first stripe portions 404 further comprise a first binding stripe portion 404a and a first standby stripe portion 404b. Similarly, the second stripe portions 504 also comprise a second binding stripe portion 504a and a second standby stripe portion 504b. The first electrode 400 is electrically connected to the first connection electrode 106 having the first electric potential V1, and the first binding stripe portion 404a extends from a plane of the adhesion layer 300, along a side of the light-emitting element 200, to a top surface of the light-emitting element 200 to be electrically connected to the first pad 202. In other words, the first electric potential V1 can be provided to the first pad 202 of the light-emitting element 200 through the extended first binding stripe portion 404a. Similarly, the second electrode 500 is electrically connected to the second connection electrode 108 having the second electric potential V2, and the second binding stripe portion 504a extends from the plane of the adhesion layer 300, along the side of the light-emitting element 200, to the top surface of the light-emitting element 200 to be electrically connected to the second pad 204. In other words, the second electric potential V2 can be provided to the second pad 204 of the light-emitting element 200 through the extended second binding stripe portion 504a. Accordingly, two different electric potentials can be provided to the light-emitting element 200 to achieve the effect of electron-hole combination in the light-emitting element 200, thereby resulting in releasing light energy. Additionally, the first standby stripe portion 404b and the second standby stripe portion 504b are configured such that the light-emitting element 200 can still be electrically connected to the first electrode 400 and the second electrode 500 even when a mounted light-emitting element 200 is offset. As a result, the first standby stripe portion 404b and the second standby stripe portion 504b are not connected to the first pad 202 and the second pad 204. A detailed description regarding a mounted and offset light-emitting element 200 is provided below.

Figure 2A:
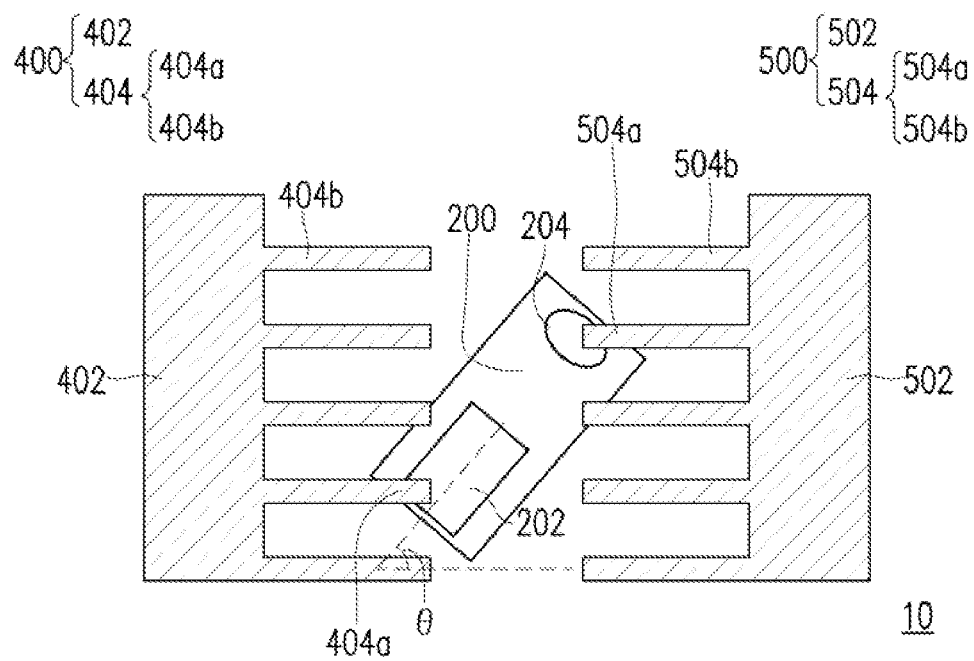
FIG. 2A to FIG. 2B are schematic drawings of a light-emitting element in an offset state in the self-emission type display of FIG. 1A.
Figure 2B:
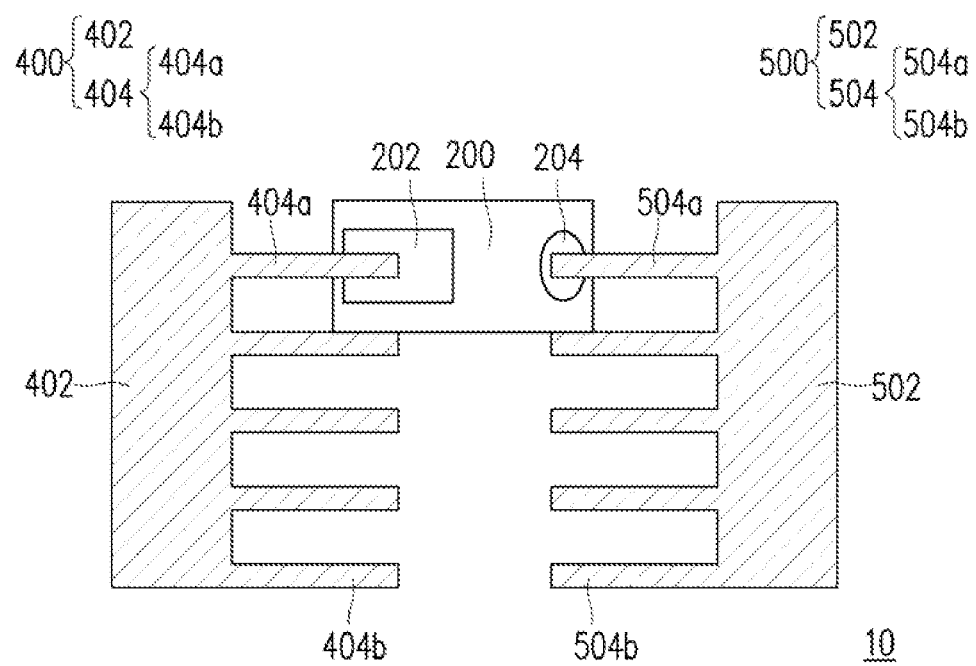

FIG. 2A to FIG. 2B are schematic drawings of the light-emitting element 200 in an offset state in the self-emission type display 10 of FIG. 1A. Please refer to FIG. 1A and FIG. 2A. A spacing m exists between each of the first stripe portions 404 and the second stripe portions 504. Additionally, the light-emitting element 200 has a length l, and the length l of the light-emitting element 200 is greater than the spacing m. When the light-emitting element 200 is mounted with a rotation offset (as shown in FIG. 2A) or a translation (as shown in FIG. 2B) and therefore forms an angle θ with the first stripe portions 404, because the length l of the light-emitting element 200 is greater than the spacing m, the first pad 202 and the second pad 204 of the offset light-emitting element 200 can still be connected to the first binding stripe portion 404a and the second binding stripe portion 504a respectively, as shown in FIG. 2A. It should be noted that (referring to FIG. 1A and FIG. 2A) when the light-emitting element 200 has a rotation offset, portions originally used as the first standby stripe portion 404b and the second standby stripe portion 504b now serve as the first binding stripe portion 404a and the second binding stripe portion 504a, connected to the first pad 202 and the second pad 204. Additionally, portions originally used as the first binding stripe portion 404a and the second binding stripe portion 504a now serve as the first standby stripe portion 404b and the second standby stripe portion 504b, not to be connected to the first pad 202 and the second pad 204.

Please refer to FIG. 1A and FIG. 2A. A gap n1 exists between any adjacent ones of the first stripe portions 404, and a gap n2 exists between any adjacent ones of the second stripe portions 504. In addition, both the first stripe portions 404 and the second stripe portions 504 have a width w. Additionally, the first pad 202 of the light-emitting element 200 has a width d1 and the second pad 204 has a width d2, and the light-emitting element 200 has a width q. When the first stripe portions 404, the second stripe portions 504, and the light-emitting element 200 meet the conditions where n1<d1, n2<d2, w<q, w≤d1, and w≤d2, it can be ensured that even when the light-emitting element 200 has a translation offset from up to down, the first pad 202 and the second pad 204 can still be connected to the first binding stripe portion 404a and the second binding stripe portion 504a respectively, as shown in FIG. 2B.

In the present embodiment, since the self-emission type display 10 has the first stripe portions 404, the second stripe portions 504, and the light-emitting element 200 which all meet the above-mentioned conditions, it can be ensured that even with a mounting alignment error, the LED 200 can still be connected to the first electrode 400 and the second electrode 500 successfully, avoiding the disconnection problem. In addition, the first electrode 400 and the second electrode 500 in the present embodiment are provided with the first stripe portions 404 and the second stripe portions 504 respectively, such that the light emitted by the LED is transmitted through gaps between the stripe electrodes, thereby effectively improving the LED's light output efficiency.

Figure 3:
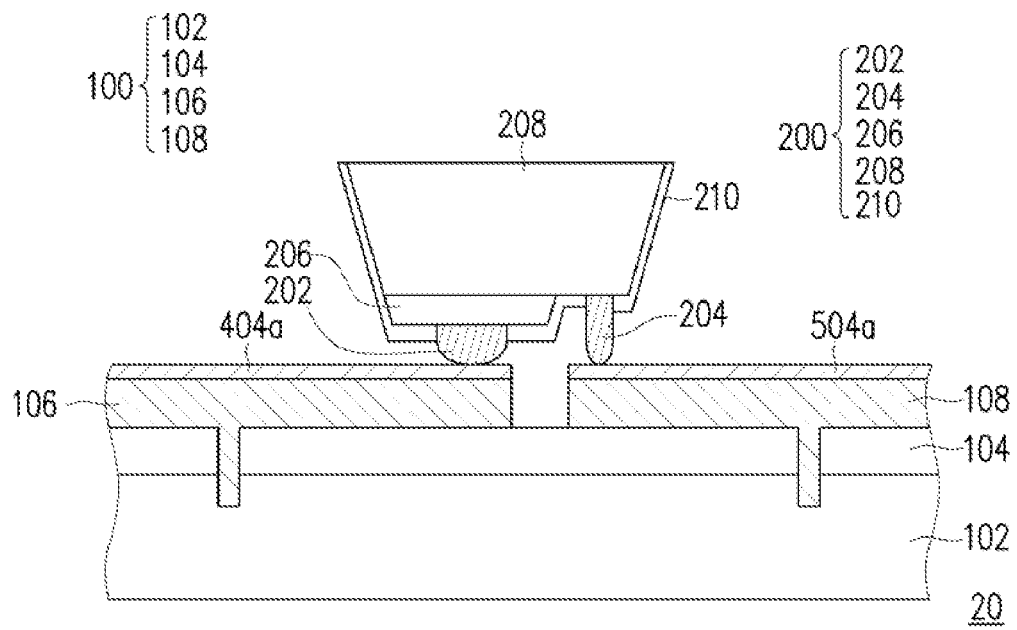
FIG. 3 is a cross-sectional schematic drawing of a self-emission type display according to another embodiment of the present invention.

FIG. 3 is a cross-sectional schematic drawing of a self-emission type display 20 according to another embodiment of the present invention. The self-emission type display 20 in the present embodiment is similar to that of the embodiment shown in FIG. 1A to FIG. 1B, and thus identical elements are indicated by similar symbols and they are not repeated herein. The present embodiment differs from the embodiment shown in FIG. 1A to FIG. 1B in that the light-emitting element 200 in the present embodiment is bonded with the carrier substrate 100 using a flip chip, and thus the adhesion layer 300 can be omitted. In other words, in the present embodiment, the first bonding stripe portion 404a of the first electrode 400 and the second bonding stripe portion 504a of the second electrode 500 are located between the carrier substrate 100 and the light-emitting element 200. Additionally, the first bonding stripe portion 404a and the second bonding stripe portion 504a extend along a surface of the first connection electrode 106 and a surface of the second connection electrode 108 respectively, and the first-type semiconductor layer 206 and the second-type semiconductor layer 208 of the light-emitting element 200 are connected to the first bonding stripe portion 404a and the second bonding stripe portion 504a respectively through the first pad 202 and the second pad 204 formed by a bump.

Similar to the embodiment shown in FIG. 1A to FIG. 1B, in the present embodiment, since the self-emission type display 20 has the specifically designed first stripe portions 404, the second stripe portions 504, and the light-emitting element 200, it can be ensured that even with a mounting alignment error, the LED 200 can still be connected to the first electrode 400 and the second electrode 500 successfully, avoiding the disconnection problem. In addition, the first electrode 400 and the second electrode 500 in the present embodiment are provided with the first stripe portions 404 and the second stripe portions 504 respectively, such that the light emitted by the LED is transmitted through gaps between the stripe electrodes, thereby effectively improving the LED's light output efficiency.

Figure 4:
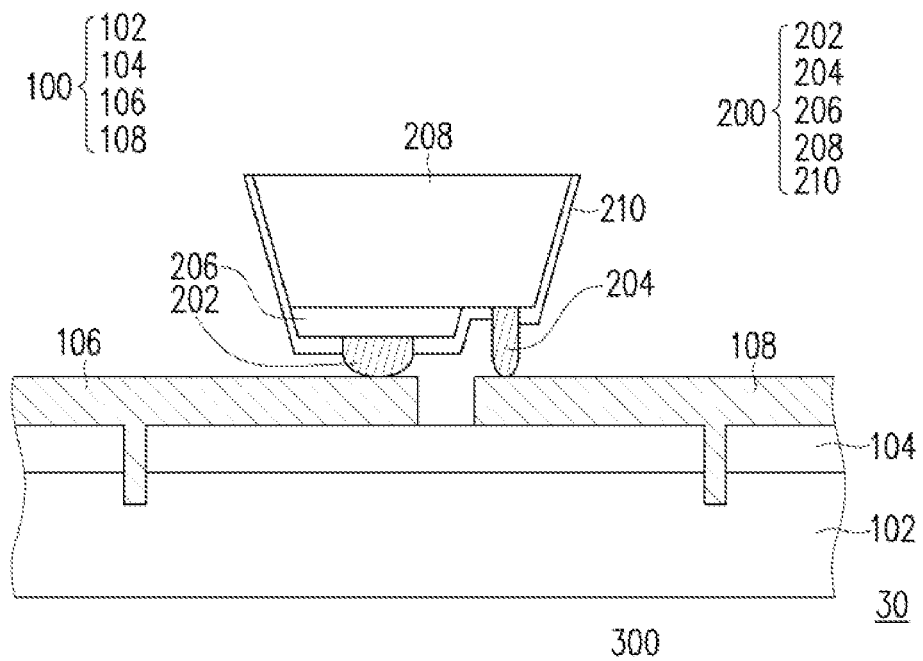
FIG. 4 is a cross-sectional schematic view of a self-emission type display according to a further embodiment of the present invention.

FIG. 4 is a cross-sectional schematic view of a self-emission type display 30 according to a further embodiment of the present invention. The self-emission type display 30 in the present embodiment is similar to that of the embodiment shown in FIG. 3, and thus identical elements are indicated by similar symbols and they are not repeated herein. The present embodiment differs from the embodiment shown in FIG. 3 in that in the present embodiment, the first connection electrode 106 is used as the first electrode 400, and the second connection electrode 108 is used as the second electrode 500. In other words, in the present embodiment, the first pad 202 of the light-emitting element 200 is directly connected to the first connection electrode 106, as the first bonding stripe portion 404a; and the second pad 204 is directly connected to the second connection electrode 108, the second bonding stripe portion 504a. Additionally, in the present embodiment, the first connection electrode 106 has a stripe electrode design similar to the first electrode 400, and the second connection electrode 108 has a stripe electrode design similar to the second electrode 500.

Similar to the embodiment shown in FIG. 3, in the present embodiment, since the self-emission type display 30 has the specifically designed first connection electrode 106, the second connection electrode 108, and the light-emitting element 200, it can be ensured that even with a mounting alignment error, the LED 200 can still be connected to the first connection electrode 106 and the second connection electrode 108 successfully, avoiding the disconnection problem. Additionally, the first connection electrode 106 and the second connection electrode 108 in the present embodiment are provided with the stripe portions respectively, such that the light emitted by the LED is transmitted through gaps between the stripe electrodes, thereby effectively improving the LED's light output efficiency. Also, in the present embodiment, the preparation of the first electrode 400 and the second electrode 500 is omitted, thereby saving the cost.

In the above embodiment, the first electrode 400 and the second electrode 500 are provided using comb electrodes with spacing among one another as an example; however, the present invention does not impose any specific limitation on the patterns of the electrodes. In other words, the first electrode 400 and the second electrode 500 may also have an electrode pattern different from the one described in the above embodiment. Different electrode pattern examples are described below.

Figure 5:
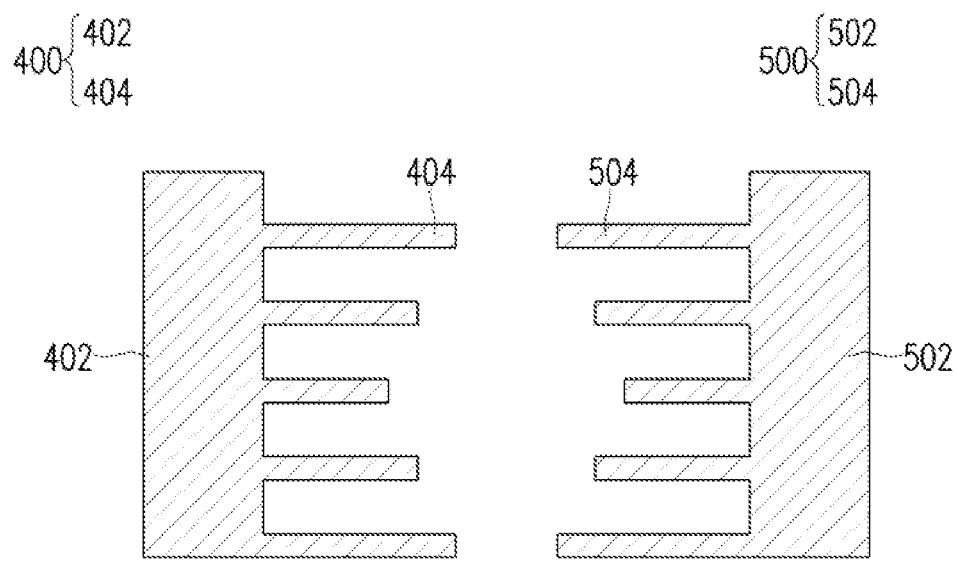
FIG. 5 is a schematic top-view drawing of a first electrode and a second electrode of a self-emission type display according to one embodiment of the present invention.

FIG. 5 is a schematic top-view drawing of a first electrode 400 and a second electrode 500 of a self-emission type display according to one embodiment of the present invention. The first electrode 400 and the second electrode 500 in the present embodiment are similar to those in the embodiment shown in FIG. 1A, and thus identical elements are indicated by similar symbols and they are not repeated herein. The present embodiment differs from the embodiment shown in FIG. 1A in that the first stripe portions 404 in the present embodiment have various lengths, and the second stripe portions 504 also have various lengths. It should be noted that in the present embodiment, the first electrode 400 and the second electrode 500 are exemplified in a mirrored arrangement, but the present invention is not limited thereto. In other embodiments, the lengths of the first stripe portions 404 and the second stripe portions 504 may also be arranged in an irregular manner.

Figure 6:
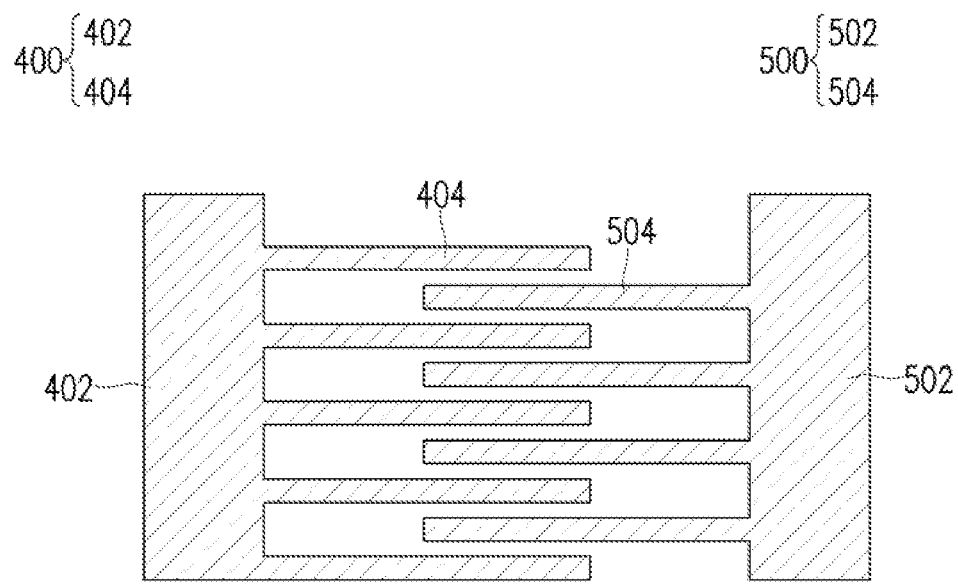
FIG. 6 is a schematic top-view drawing of a first electrode and a second electrode of a self-emission type display according to another embodiment of the present invention.

FIG. 6 is a schematic top-view drawing of a first electrode 400 and a second electrode 500 of a self-emission type display according to another embodiment of the present invention. The first electrode 400 and the second electrode 500 in the present embodiment are similar to those in the embodiment shown in FIG. 1A, and thus identical elements are indicated by similar symbols and they are not repeated herein. The present embodiment differs from the embodiment shown in FIG. 1A in that the first stripe portions 404 and the second stripe portions 504 in the present embodiment are in a staggered arrangement. In other words, in the present embodiment, each of the second stripe portions 504 is located between two adjacent ones of the first stripe portions 404. In the present embodiment, since the first stripe portions 404 and the second stripe portions 504 are in a staggered arrangement, spaces taken by the first electrode 400 and the second electrode 500 can be reduced to achieve microminiaturization.

Figure 7:
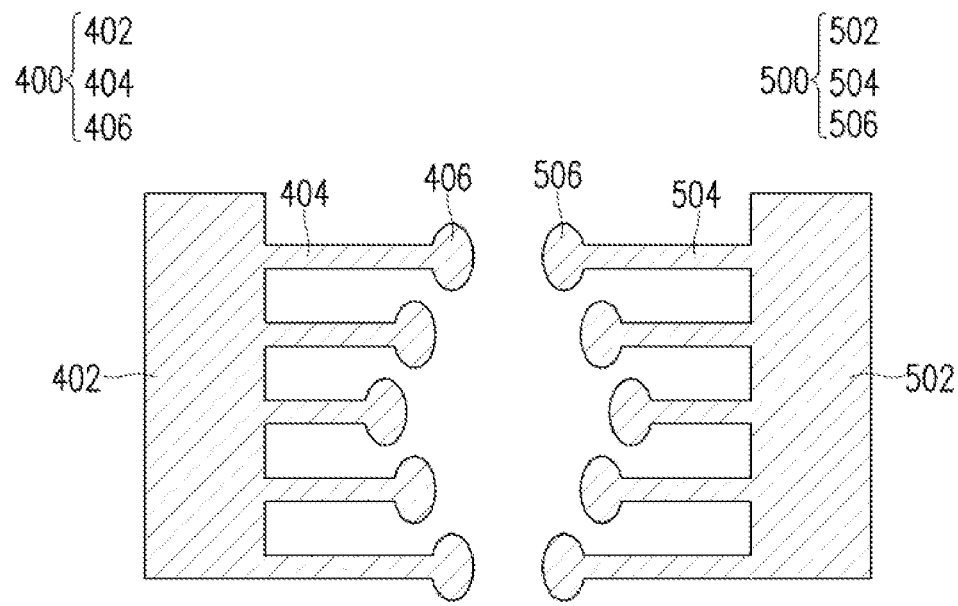
FIG. 7 is a schematic top-view drawing of a first electrode and a second electrode of a self-emission type display according to a further embodiment of the present invention.

FIG. 7 is a schematic top-view drawing of a first electrode 400 and a second electrode 500 of a self-emission type display according to a further embodiment of the present invention. The first electrode 400 and the second electrode 500 in the present embodiment are similar to those in the embodiment shown in FIG. 5, and thus identical elements are indicated by similar symbols and they are not repeated herein. The present embodiment differs from the embodiment shown in FIG. 5 in that in the present embodiment, the first electrode 400 further comprises a first enlarged portion 406, and the second electrode 500 further comprises a second enlarged portion 506. In the present embodiment, the first enlarged portion 406 and the second enlarged portion 506 are provided using circular patterns as examples, but the present invention is not limited thereto. In other embodiments, the first enlarged portion 406 and the second enlarged portion 506 may also be in other patterns, such as rectangular or square patterns. In the present embodiment, the first enlarged portion 406 and the second enlarged portion 506 can increase the connecting areas between the first pad 202 and the second pad 204 of the light-emitting element 200 and the first electrode 400 and the second electrode 500.

Figure 8:
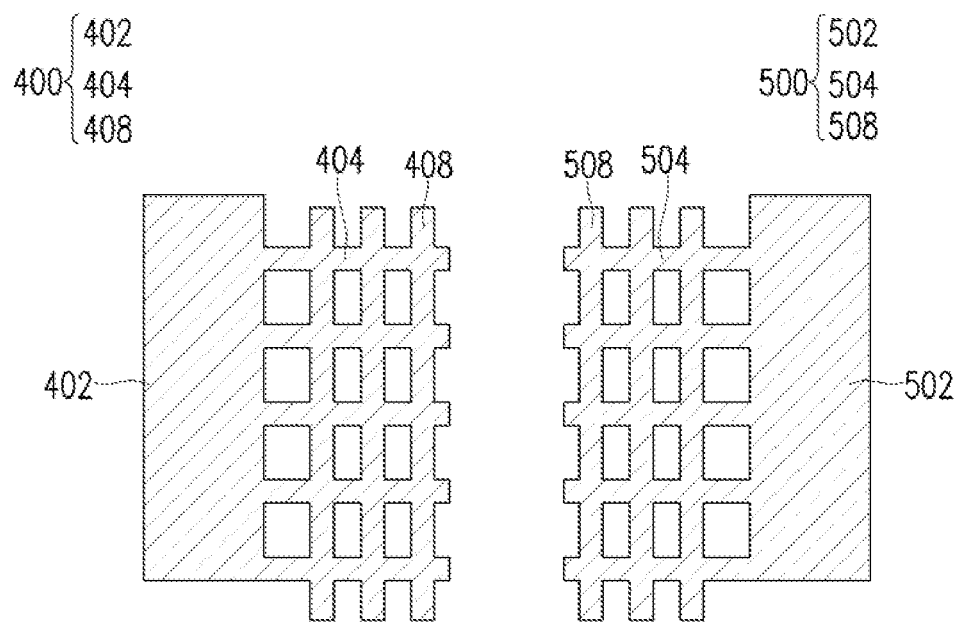
FIG. 8 is a schematic top-view drawing of a first electrode and a second electrode of a self-emission type display according to still another embodiment of the present invention.

FIG. 8 is a schematic top-view drawing of a first electrode 400 and a second electrode 500 of a self-emission type display according to yet another embodiment of the present invention. The first electrode 400 and the second electrode 500 in the present embodiment are similar to those in the embodiment shown in FIG. 1A, and thus identical elements are indicated by similar symbols and they are not repeated herein. The present embodiment differs from the embodiment shown in FIG. 1A in that in the present embodiment, the first electrode 400 further comprises a plurality of first connecting portions 408, and the second electrode 500 further comprises a plurality of second connecting portions 508. The first connecting portions 408 are interleaved with the first stripe portions 404, and the second connecting portions 508 are interleaved with the second stripe portions 504. In other words, in the present embodiment, the first electrode 400 and the second electrode 500 are in a mesh pattern. It should be noted that in the present embodiment, the first connecting portions 408 and the second connecting portions 508 are linear, the first connecting portions 408 and the first stripe portions 404 are perpendicular to each other, and the second connecting portions 508 and the second stripe portions 504 are also perpendicular to each other; but the present invention is not limited thereto. In other embodiments, other angles may exist between the first connecting portions 408 and the first stripe portions 404; likewise, other angles may exist between the second connecting portions 508 and the second stripe portions 504.

Figure 9:
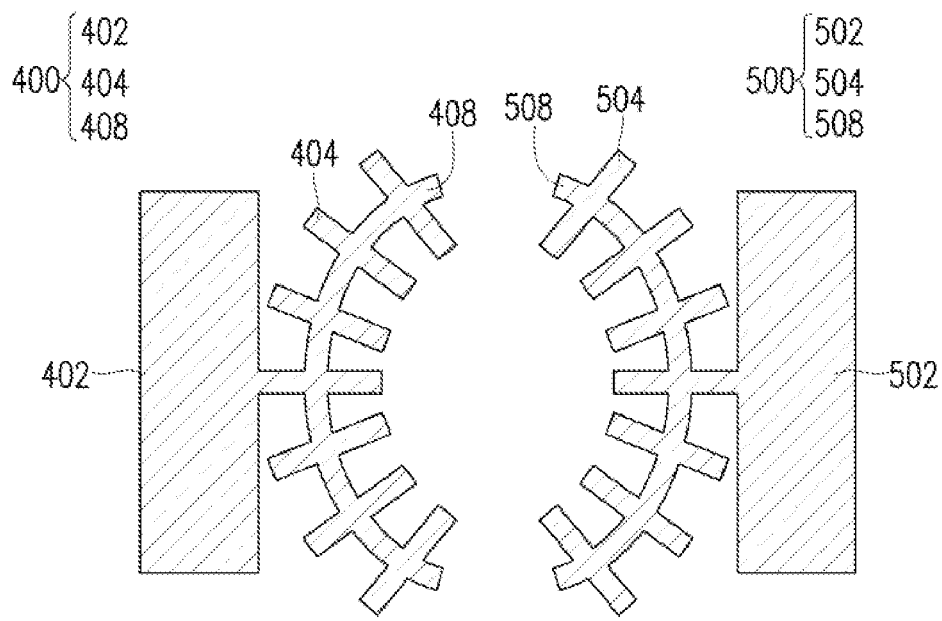
FIG. 9 is a schematic top-view drawing of a first electrode and a second electrode of a self-emission type display according to another embodiment of the present invention.

FIG. 9 is a schematic top-view drawing of a first electrode and a second electrode of a self-emission type display according to another embodiment of the present invention; i.e., a schematic top-view drawing of a first electrode 400 and a second electrode 500 of the self-emission type display. The first electrode 400 and the second electrode 500 in the present embodiment are similar to those in the embodiment shown in FIG. 1A, and thus identical elements are indicated by similar symbols and they are not repeated herein. The present embodiment differs from the embodiment shown in FIG. 1A in that in the present embodiment, the first electrode 400 further comprises a first connecting portion 408, and the second electrode 500 further comprises a second connecting portion 508. The first connecting portion 408 is interleaved with the first stripe portions 404, and the second connecting portion 508 is interleaved with the second stripe portions 504. Additionally, only one of the first stripe portions 404 is connected to the first main body portion 402, and only one of the second stripe portions 504 is connected to the second main body portion 502. Also, in the present embodiment, the first connecting portion 408 and the second connecting portion 508 are arcs opposite to each other.

Figure 10:
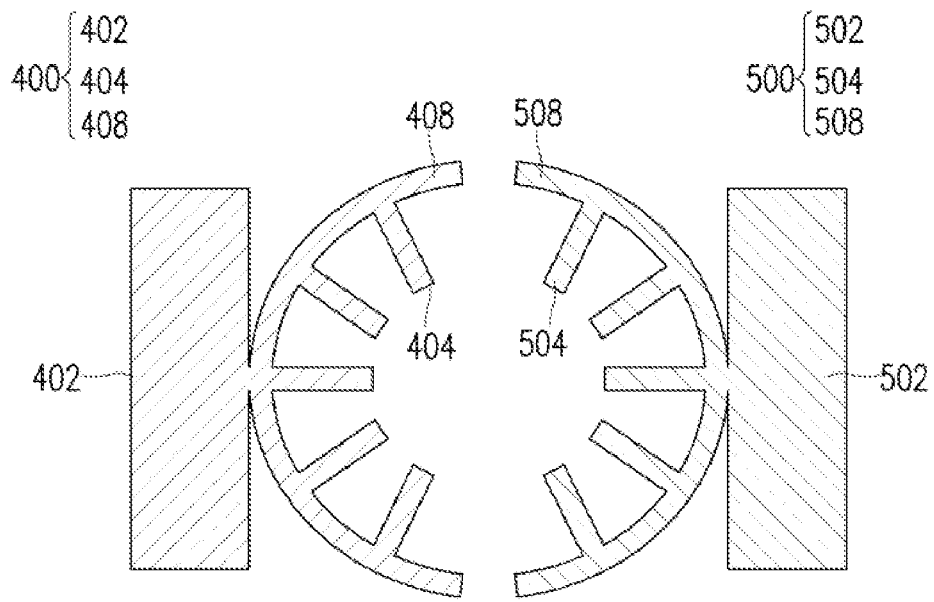
FIG. 10 is a schematic top-view drawing of a first electrode and a second electrode of a self-emission type display according to a further embodiment of the present invention.

FIG. 10 is a schematic top-view drawing of a first electrode 400 and a second electrode 500 of a self-emission type display according to yet another embodiment of the present invention. The first electrode 400 and the second electrode 500 in the present embodiment are similar to those in the embodiment shown in FIG. 9, and thus identical elements are indicated by similar symbols and they are not repeated herein. The present embodiment differs from the embodiment shown in FIG. 9 in that in the present embodiment, the first connecting portion 408 is located between the first stripe portions 404 and the first main body portion 402, and the second connecting portion 508 is located between the second stripe portions 504 and the second main body portion 502. In other words, in the present embodiment, the first stripe portions 404 are connected to the first main body portion 402 through the first connecting portion 408, and the second stripe portions 504 are connected to the second main body portion 502 through the second connecting portion 508.

In sum, since the self-emission type display of the present invention has the electrodes extending to a large extent, it can be ensured that even when a mounting alignment error occurs, the LED can still be connected to the electrodes successfully, avoiding the disconnection problem. Meanwhile, the electrodes of the present invention are stripe electrodes, such that the light emitted by the LED is transmitted through spaces between the stripe electrodes, thereby effectively improving its light output efficiency.

Even though the present invention has been disclosed with the abovementioned embodiments, it is not limited thereto. Any person of ordinary skill in the art may make some changes and adjustments without departing from the spirit and scope of the present invention. Therefore, the scope of the present invention is defined in view of the appended claims.

What is claimed is:

1. A self-emission type display, comprising:
   a carrier substrate;
   a light-emitting element, disposed on the carrier substrate, wherein the light-emitting element has a first pad and a second pad;
   a first electrode, having a plurality of first stripe portions connected to a first electric potential, wherein the first pad of the light-emitting element is electrically connected to the carrier substrate through at least one of the first strip portions; and
   a second electrode, having a plurality of second stripe portions connected to a second electric potential, wherein the first electrode and the second electrode are separated from each other, at least a part of the light-emitting element overlaps a space between at least one of the first stripe portions and at least one of second stripe portions, the second pad of the light-emitting element is electrically connected to the carrier substrate through at least one of the second strip portions, and the first electric potential is different from the second electric potential,
   wherein the first stripe portions comprise at least one first binding stripe portion and a plurality of first standby stripe portions, the at least one first binding stripe portion is connected to the first pad, and the first standby stripe portions are not connected to the first pad, and
   wherein the second stripe portions comprise at least one second binding stripe portion and a plurality of second standby stripe portions, the at least one second binding stripe portion is connected to the second pad, and the second standby stripe portions are not connected to the second pad.

2. The self-emission type display according to claim 1, wherein the carrier substrate comprises an active element array substrate, configured to provide the first electric potential and the second electric potential.

3. The self-emission type display according to claim 2, wherein the second electric potential is a common potential ($V_{ss}$), and the first electric potential is greater than the second electric potential.

4. The self-emission type display according to claim 1, wherein the first electrode and the second electrode cover the light-emitting element.

5. The self-emission type display according to claim 1, wherein the first electrode and the second electrode are located between the carrier substrate and the light-emitting element.

6. The self-emission type display according to claim 1, wherein the first pad has a width d1, and a gap n1 exists between any adjacent ones of the first stripe portions, and n1<d1.

7. The self-emission type display according to claim 6, wherein the second pad has a width d2, and a gap n2 exists between any adjacent ones of the second stripe portions, and n2<d2.

8. The self-emission type display according to claim 7, wherein the light-emitting element has a width q, and the first stripe portions and the second stripe portions have a width w, and w<q, w≤d1, w≤d2.

9. The self-emission type display according to claim 1, wherein a spacing m exists between each of the first stripe portions and each of the second stripe portions, the light-emitting element has a length l, and m<l.

10. The self-emission type display according to claim 1, wherein the first electrode further comprises a first main body portion, the second electrode further comprises a second main body portion, at least one of the first strip portions is electrically connected to the first main body portion, and at least one of the second strip portions is electrically connected to the second main body portion.

11. The self-emission type display according to claim 10, wherein the first electrode further comprises a plurality of first enlarged portions located at ends of the first strip portions, and the second electrode further comprises a plurality of second enlarged portions located at ends of the second strip portions.

12. The self-emission type display according to claim 10, wherein each of the second stripe portions is located between two adjacent ones of the first stripe portions.

13. The self-emission type display according to claim 10, wherein the first electrode further comprises at least one first connecting portion interleaved with the first strip portions, and the second electrode further comprises at least one second connecting portion interleaved with the second strip portions.

14. The self-emission type display according to claim 13, wherein the first connecting portion and the second connecting portion are linear or arc-shaped.

15. The self-emission type display according to claim 14, wherein the first connecting portion is located between the first stripe portion and the first main body portion, and the second connecting portion is located between the second stripe portion and the second main body portion.

16. The self-emission type display according to claim 1, wherein the display further comprises an adhesion layer located between the carrier substrate and the light-emitting element.

\* \* \* \* \*